United States Patent
Pawlak et al.

(10) Patent No.: US 10,453,750 B2
(45) Date of Patent: Oct. 22, 2019

(54) STACKED ELONGATED NANOSHAPES OF DIFFERENT SEMICONDUCTOR MATERIALS AND STRUCTURES THAT INCORPORATE THE NANOSHAPES

(71) Applicant: GLOBALFOUNDRIES INC., Grand Cayman (KY)

(72) Inventors: Bartlomiej J. Pawlak, Leuven (BE); Guillaume Bouche, Albany, NY (US); Ajey P. Jacob, Watervliet, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/629,884

(22) Filed: Jun. 22, 2017

(65) Prior Publication Data

US 2018/0374753 A1    Dec. 27, 2018

(51) Int. Cl.
*H01L 25/07* (2006.01)
*H01L 21/324* (2006.01)
(Continued)

(52) U.S. Cl.
CPC ...... *H01L 21/823431* (2013.01); *B82Y 10/00* (2013.01); *H01L 21/02488* (2013.01);
(Continued)

(58) Field of Classification Search
None
See application file for complete search history.

(56) References Cited

U.S. PATENT DOCUMENTS 7,601,570 B2   10/2009  Damlencourt
8,173,993 B2    5/2012  Bangsaruntip et al.
(Continued)

FOREIGN PATENT DOCUMENTS

TW    200611406 A    4/2006
TW    200616051 A    5/2006
(Continued)

OTHER PUBLICATIONS

Provided by IMEC, APA citation: "World's first vertically stacked gate-all-around Si nanowire CMOS transistors" (Dec. 23, 2016) retrieved Jun. 14, 2017 from https://phys.org/news/2016-12-world-vertically-stacked-gateall-around-si.html, pp. 1-2.
(Continued)

*Primary Examiner* — Joseph C. Nicely
*Assistant Examiner* — Lamont B Koo
(74) *Attorney, Agent, or Firm* — Gibb & Riley, LLC; Anthony J. Canale

(57) ABSTRACT

Disclosed herein are a method of forming stacked elongated nanoshapes (NSs) (e.g., stacked nanowires (NWs)) of different semiconductor materials above a substrate, a method of forming different devices (e.g., stacked field effect transistors (FETs) having different type conductivities) using the stacked NSs and the resulting structures. In the methods, stacked elongated NSs made of the same first semiconductor material can be formed above a substrate. The stacked elongated NSs can include at least a first NS and a second NS above the first NS. The second NS can then be selectively processed in order to convert the second NS from the first semiconductor material to a second semiconductor material. The first and second NSs can subsequently be used to form first and second devices, respectively, wherein the second device is stacked above the first device. The first and second device can be, for example, first and second FETs, respectively.

18 Claims, 14 Drawing Sheets

(51) Int. Cl.

| | | |
|---|---|---|
| *H01L 21/8234* | (2006.01) | |
| *H01L 21/02* | (2006.01) | |
| *H01L 27/088* | (2006.01) | |
| *H01L 29/06* | (2006.01) | |
| *H01L 29/66* | (2006.01) | |
| *H01L 21/822* | (2006.01) | |
| *H01L 21/8238* | (2006.01) | |
| *H01L 27/06* | (2006.01) | |
| *H01L 27/092* | (2006.01) | |
| *B82Y 10/00* | (2011.01) | |
| *H01L 29/423* | (2006.01) | |
| *H01L 29/775* | (2006.01) | |

(52) U.S. Cl.
CPC .. *H01L 21/02532* (2013.01); *H01L 21/02664* (2013.01); *H01L 21/8221* (2013.01); *H01L 21/823437* (2013.01); *H01L 21/823807* (2013.01); *H01L 27/0688* (2013.01); *H01L 27/0886* (2013.01); *H01L 27/092* (2013.01); *H01L 29/0673* (2013.01); *H01L 29/42392* (2013.01); *H01L 29/66227* (2013.01); *H01L 29/66439* (2013.01); *H01L 29/775* (2013.01); *H01L 21/823814* (2013.01)

(56) References Cited

U.S. PATENT DOCUMENTS

| | | |
|---|---|---|
| 8,679,902 B1 | 3/2014 | Basker et al. |
| 9,425,293 B1* | 8/2016 | Balakrishnan ...... H01L 29/0673 |
| 9,437,501 B1 | 9/2016 | Cheng et al. |
| 2003/0139000 A1 | 7/2003 | Bedell et al. |
| 2008/0135949 A1 | 6/2008 | Lo et al. |
| 2017/0005190 A1 | 1/2017 | Chang et al. |
| 2017/0077232 A1 | 3/2017 | Balakrishnan et al. |
| 2018/0277628 A1* | 9/2018 | Bi .................... H01L 29/0684 |

FOREIGN PATENT DOCUMENTS

| | | |
|---|---|---|
| TW | 200826161 A | 6/2008 |
| TW | I304622 B | 12/2008 |

OTHER PUBLICATIONS

Peng Zheng et al., "FinFET Evolution Toward Stacked-Nanowire FET for CMOS Technology Scaling", IEEE.org, Oct. 27, 2015, pp. 1-4.

Gaillardon et al., "Nanowire systems: technology and design", Phil. Trans. R. Soc. A 372, Jan. 2, 2013, pp. 1-15.

Wilfried Vandervorst et al., "Fabrication of (Silicon)-Germanium on Insulator Substrates by the Germanium Condensation Technique", Katholieke Universiteit Leuven—Faculteit Wetenschap & Technologie Arenbergkasteel, B-3001 Heverlee (Belgie), Apr. 2012, pp. 1-2, and 24-72.

Davide Sacchetto et al.,"Vertically-stacked gate-all-around polysilicon nanowire FETs with sub-lm gates patterned by nanostencil lithography", Microelectronic Engineering 98, Jul. 25, 2012, pp. 355-358.

Taiwanese Application No. 106145999, Examination Report dated Feb. 21, 2019 and Search Report dated Feb. 9, 2019, pp. 1-6.

Taiwanese Application No. 106145999, Rejection Decision dated Jul. 17, 2019, pp. 1-13.

* cited by examiner

THERMAL ANNEAL

STACKED ELONGATED NANOSHAPES OF DIFFERENT SEMICONDUCTOR MATERIALS AND STRUCTURES THAT INCORPORATE THE NANOSHAPES

BACKGROUND

Field of the Invention

The present invention relates to semiconductor structures and, more particularly, to methods of forming semiconductor structures that allow for device size scaling and to the resulting semiconductor structures, which include stacked semiconductor devices (e.g., stacked field effect transistors (FETs) having different type conductivities).

Description of Related Art

Integrated circuit (IC) design decisions are often driven by device scalability, device density, manufacturing efficiency and costs. For example, size scaling of planar field effect transistors (FETs) resulted in the development of planar FETs with relatively short channel lengths but, unfortunately, the smaller channel lengths resulted in a corresponding increase in short channel effects.

In response, fin-type FETs (FINFETs) were developed. A FINFET is a non-planar FET that incorporates a semiconductor fin (i.e., a relatively tall and thin, elongated, rectangular-shaped, semiconductor body) and, within the semiconductor fin, a channel region positioned laterally between source/drain regions. A gate structure is positioned adjacent to the top surface and opposing sidewalls of the semiconductor fin at the channel region. Such a FINFET exhibits two-dimensional field effects as compared to the single-dimensional field effects exhibited by a planar FET and, thus, exhibits improved gate control over the channel. It should be noted that, because the semiconductor fin is so thin, any field effects exhibited at the top surface are insignificant (i.e., negligible).

Recently, to improve drive current, electrostatics and allow for further device size scaling, devices such as nanowire-type FETs (NWFETs) and other similar-type FETs with elongated nanoshape(s) as channel region(s) and wrap-around gate structures, have been developed. For example, a NWFET, like a FINFET, is a non-planar FET that is formed using a semiconductor fin. However, in this case, a portion of the semiconductor fin, which is positioned laterally between the source/drain regions, is processed to form one or more nanowires of the same semiconductor material. The nanowire(s) can extend laterally between the source/drain regions. Additionally, in the case of multiple nanowires, they can be physical separated from each other, parallel to each other, and side-by-side and/or stacked one above the other. A gate structure can be formed so that it wraps around the nanowire(s) such that the nanowire(s) can function as channel region(s). Such a NWFET exhibits multi-dimensional field effects as compared to the two dimensional field effects exhibited by FINFET and, thus, exhibits improved gate control over the channel region(s).

However, device scalability is an on-going consideration in IC design and changing the above-described FET structures and/or the methods by which they are formed may allow for further size scaling.

SUMMARY

In view of the foregoing, disclosed herein is a method of forming stacked elongated nanoshapes (NSs) (e.g., stacked nanowires (NWs), stacked nanosheets, or stacked nanofins) of different semiconductor materials above a substrate. In this method, stacked elongated NSs can be formed above a substrate such that all of the NSs are made of a first semiconductor material. These stacked elongated NSs can be oriented parallel to the top surface of the substrate, can be stacked one above the other, and can be physically separated from each other. The stacked elongated NSs can include one or more lower NSs (referred to herein as first NS(s)) and one or more upper NSs (referred to herein as second NS(s)) that are above the first NS(s). Once the stacked NSs are formed, the second NS(s) can be selectively processed in order to convert the second NS(s) from the first semiconductor material to a second semiconductor material that is different from the first semiconductor material. The first and second NSs can subsequently be used to form first and second devices, respectively, wherein the second device is stacked above the first device.

For example, also disclosed herein is a method of forming stacked field effect transistors (FETs) having different type conductivities (e.g., for use in complementary metal oxide semiconductor (CMOS) circuitry). In this method, stacked elongated nanoshapes (NSs) can be formed above a substrate, as discussed above, such that all of the NSs are made of first semiconductor material. These stacked elongated NSs can be oriented parallel to a top surface of the substrate, can be stacked one above the other, and can be physically separated from each other. Specifically, the stacked elongated NSs can include at least one first NS, which is adjacent to, but physically separated from, the top surface of the substrate, and at least one second NS, which is parallel to and physically separated from the first NS such that the first NS is positioned (i.e., stacked) between the second NS and the top surface of the substrate. More specifically, the stacked elongated NSs can include one or more lower NSs (referred to herein as the first NS(s)) and one or more upper NSs (referred to herein as the second NS(s)) that are above the first NS(s). Once the stacked NSs are formed, the second NS(s) can be selectively processed in order to convert the second NS(s) from the first semiconductor material to a second semiconductor material that is different from the first semiconductor material. The first and second NSs can subsequently be used to form first and second FETs, respectively, wherein the first FET has a first-type conductivity (e.g., N-type conductivity), the second FET has a second-type conductivity (e.g., P-type conductivity) that is different from the first-type conductivity, and the second FET is stacked above the first FET.

By enabling the stacking of elongated NSs made of different materials as well as the stacking of different devices (e.g., FETs with different type conductivities), the disclosed methods result in structures that consume less of the available surface area of the substrate and, thereby allow for further size scaling.

Also disclosed herein are semiconductor structures formed according to the above-described methods. Specifically, disclosed herein is a semiconductor structure that includes substrate and stacked elongated nanoshapes (NSs) above the substrate. These stacked elongated NSs can be oriented parallel to the top surface of the substrate, can be stacked one above the other, and can be physically separated from each other. Specifically, the stacked elongated NSs can include at least one first NS, which is adjacent to, but physically separated from, the top surface of the substrate, and at least one second NS, which is parallel to and physically separated from the first NS such that the first NS is positioned (i.e., stacked) between the second NS and the top surface of the substrate. More specifically, the stacked elongated NSs can include one or more lower NSs (referred to herein as the first NS(s)) made of a first semiconductor material and one or more upper NSs (referred to herein as the second NS(s)) that are above the first NS(s) and made of a second semiconductor material, which is different from the first semiconductor material.

Also disclosed herein is a semiconductor structure that incorporates these stacked NSs. Specifically, this semiconductor structure can include a first device, which is formed using the first NS(s), and a second device, which is formed using the second NS(s). Thus, the second device is stacked above the first device (i.e., the first device is between the second device and the top surface of the substrate). For example, this semiconductor structure can include a first field effect transistor (FET) and a second FET stacked above the first FET. The first FET can have a first-type conductivity (e.g., N-type conductivity) and can incorporate the first NS(s) as channel region(s). The second FET can have a second-type conductivity (e.g., P-type conductivity) and can incorporate the second NS(s) as channel regions.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, scalability is an on-going consideration in integrated circuit (IC) design and changing the design of current state-of-the art nanowire-type or other similar-type field effect transistor (FET) structures and/or the methods by which they are formed may allow for further size scaling.

In view of the foregoing, disclosed herein are a method of forming stacked elongated nanoshapes (NSs) (e.g., stacked nanowires (NWs), nanosheets or nanofins) of different semiconductor materials above a substrate, a method of forming different stacked devices (e.g., stacked field effect transistors (FETs) having different type conductivities for complementary metal oxide semiconductor (CMOS) circuitry) using the stacked NWs, and the resulting structures. Specifically, stacked elongated NSs made of the same first semiconductor material can be formed above a substrate. The stacked elongated NSs can include at least a first NS and a second NS above the first NS. The second NS can then be selectively processed in order to convert the second NS from the first semiconductor material to a second semiconductor material. The first and second NSs can subsequently be used to form first and second devices, respectively, wherein the second device is stacked above the first device. The first and second devices can be, for example, first and second FETs, respectively. By enabling the stacking of NSs that are made of different materials as well as the stacking of different devices (e.g., FETs with different type conductivities), the disclosed methods result in structures that consume less of the available surface area of the substrate and, thereby allow for further size scaling.

Figure 1:
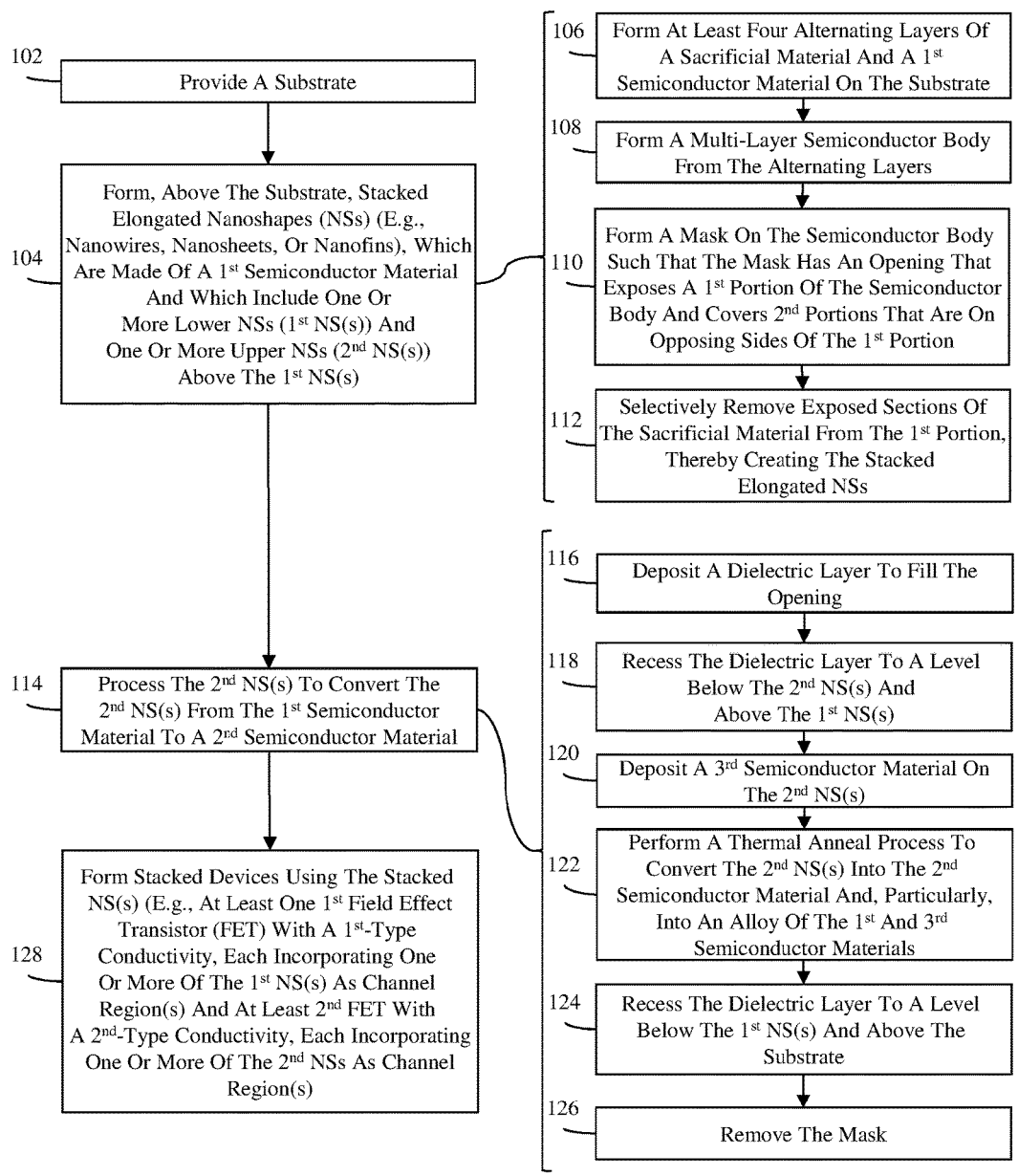
FIG. 1 is a flow diagram illustrating the disclosed methods.

More particularly, referring to the flow diagram of FIG. 1 disclosed herein are methods of forming stacked elonaged nanoshapes (NSs) of different semiconductor materials above a substrate and further forming stacked devices (e.g., stacked field effect transistors (FETs)) using the stacked NSs.

For purposes of this disclosure, an elongated nanoshape refers to a feature having a length that is relatively long as compared to its thickness (also referred to herein as its height) and/or its width (also referred to herein as its depth) and further having its thickness and/or its width dimensions constrained to tens of nanometers or less (i.e., constrained to 100 nm or less). A nanowire (NW) refers to a nanoshape having both its thickness (or height) and its width dimensions constrained to tens of nanometers or less (i.e., constrained to 100 nm or less) and preferably having the ratio of the thickness dimension to the width dimension being, for example, approximately 1 to 1. A nanosheet refers to a nanoshape having its thickness dimension (or height) constrained to tens of nanometers or less (i.e., constrained to 100 nm or less), having its width dimension above 100 nm, and having the ratio of the thickness dimension to the width dimension being, for example, significantly over 1 to 1 (e.g., 2 to 1, 5 to 1, 10 to 1, 100 to 1, etc.). That is, a nanosheet is relatively short and wide. A nanofin refers to a nanoshape having its width dimension constrained to tens of nanometers or less (i.e., constrained to 100 nm or less), having its thickness (or height) dimension being greater than 100 nm and having the ratio of the thickness dimension to the width dimension being, for example, significantly less than 1 to 1 (e.g., 1 to 2, 1 to 5, 1 to 10, 1 to 100, etc.). That is, a nanofin is relatively tall and thin.

Figure 2:
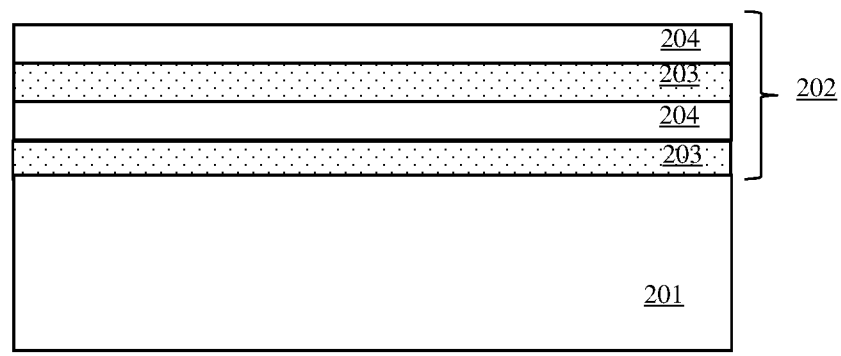
FIG. 2 is a cross-section diagram illustrating partially completed structure formed according to the flow diagram of FIG. 1.

The methods begin with a substrate 201 (see process 102 and FIG. 2). The substrate 201 can be a bulk semiconductor substrate, as illustrated. The bulk semiconductor substrate can, for example, be made of a first semiconductor material (e.g., silicon). The bulk semiconductor substrate can optionally include ground plane doping in the form of well region(s) (not shown) in order to prevent through-substrate leakage from subsequently formed devices thereon. Alternatively, the substrate 201 can be a semiconductor-on-insulator substrate, which includes a semiconductor substrate, an insulator layer on the semiconductor substrate and a semiconductor layer on the insulator layer. For example, the substrate 201 can be a silicon-on-insulator (SOI) substrate, which includes a silicon substrate, a silicon dioxide ($SiO_2$) insulator layer on the silicon substrate and a silicon layer on the insulator layer.

Stacked elongated nanoshapes (NSs) (e.g., nanowires (NWs), nanosheets or nanofins) can be formed above the substrate 201 such that all of the NSs are made of the first semiconductor material (e.g., silicon) (see process 104). To form such stacked NSs, alternating layers 202 of a sacrificial material 203 and the first semiconductor material 204 can be formed on the top surface of the substrate 201 (see process 106 and FIG. 2). For purposes of illustration, four alternating layers 202 including two layers of the sacrificial material 203 and two layers of the first semiconductor material 204 are shown. However, it should be understood that any number of four or more alternating layers 202 could be formed at process 106. As mentioned above, the first semiconductor material 204 can, for example, be silicon. The sacrificial material 203 can be any suitable sacrificial material that is different from the first semiconductor material 204 and can be selectively etched over that first semiconductor material 204. For example, if the first semiconductor material is silicon, the sacrificial material 203 can be a sacrificial semiconductor material and, particularly, a different semiconductor material from the first semiconductor material 204, such as silicon germanium, silicon carbide, etc. Alternatively, the sacrificial material could be a sacrificial dielectric material.

Optionally, during formation of the alternating layers 202, the lower layer(s) of the first semiconductor material 204 and upper layer(s) of the first semiconductor material 204 within the alternating layers 202 can be doped so as to different type conductivities to ensure that lower NS(s) and upper NS(s), which will be formed using portions of the layers of the first semiconductor material 204 will have different type conductivities, respectively. For example, the upper layer(s) of the first semiconductor material 204 can be doped so as to have a first-type conductivity at a relatively low conductivity (e.g., N− conductivity) and the lower layer(s) of the first semiconductor material 204 can be doped so as to have a second-type conductivity at a relatively low conductivity level (e.g., P− conductivity). Alternatively, during formation of the alternating layers 202, the first semiconductor material 204 within the alternating layers 202 can remain undoped.

Figure 3A:
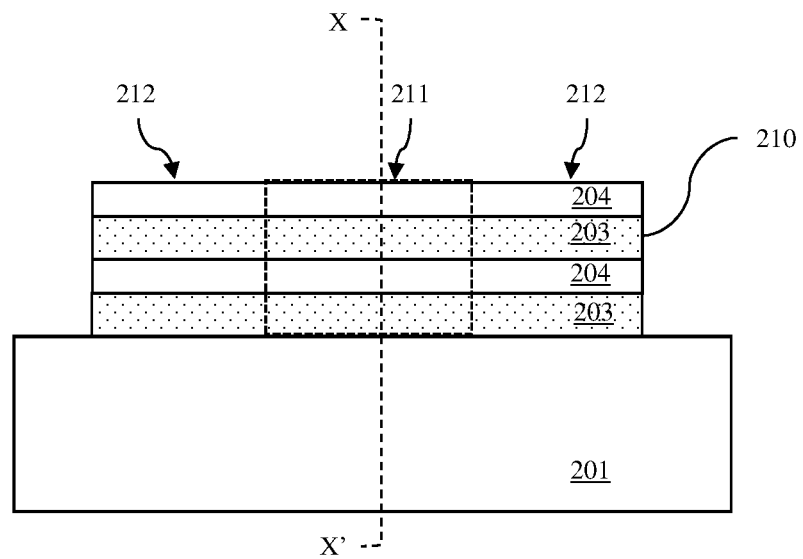
FIGS. 3A and 3B are different cross-section diagrams illustrating a partially completed structure formed according to the flow diagram of FIG. 1.
Figure 3B:
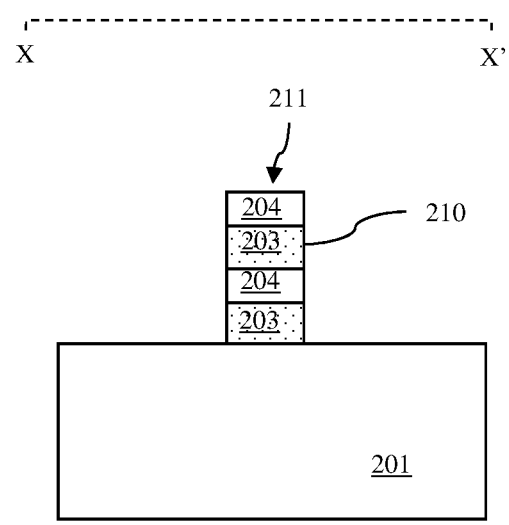
Figure 3C:
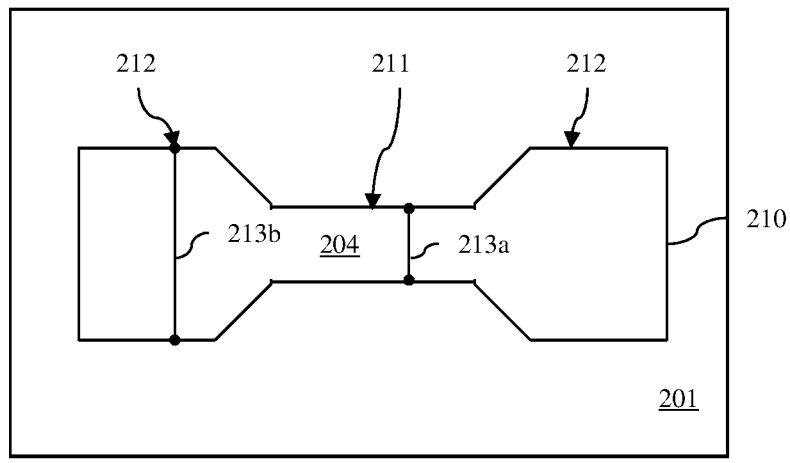
FIGS. 3C and 3D are alternative top view diagrams of the partially completed structure shown in FIGS. 3A and 3B.
Figure 3D:
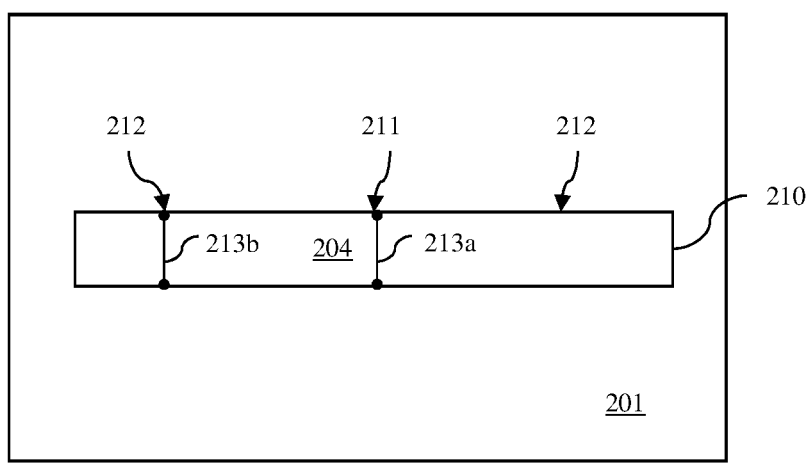

The alternating layers 202 can subsequently be patterned to form a multi-layer semiconductor body 210 on the substrate 201 (see process 108 and FIGS. 3A-3D). Specifically, lithographic patterning and etch processes (or any other suitable patterning and etch processes) can be performed in order to pattern the alternating layers 202 into a multi-layer semiconductor body 210. This multi-layer semiconductor body 210 can have a first portion 211 with a first width 213a and can further having second portions 212 with a second width 213b. The first portion 211 can be positioned laterally between the second portions 212. FIG. 3C is an exemplary top view of the partially completed structure shown in FIGS. 3A-3B illustrating that, in the multi-layer semiconductor body 210, the first width 213a of the first portion 211 can be less than the second width 213b of the second portions 212. FIG. 3D is an alternative exemplary top view of the partially completed structure shown in FIGS. 3A-3B illustrating that the multi-layer semiconductor body 210 can be a multi-layer semiconductor fin (i.e., a relatively thin, elongated, essentially rectangular-shaped semiconductor body), wherein the first width 213a of the first portion 211 is approximately equal to the second width 213b of the second portions 212. Optionally, the first portion 211 can be patterned into multiple parallel sections positioned side-by-side and extending laterally between the second portions 212 (not shown).

It should be noted that, since, as described in detail below, each layer of the first semiconductor material 204 within the first portion 211 of the multi-layer semiconductor body 210 will subsequently be made into an elongated nanoshape (NS) (as defined above), the thickness of each layer of the first semiconductor material 204 and/or the first width 213a of the first portion 211 of the multi-layer semiconductor body 210 should be constrained to tens of nanometers or less (i.e., constrained to 100 nm or less), as discussed in detail above.

Figure 4A:
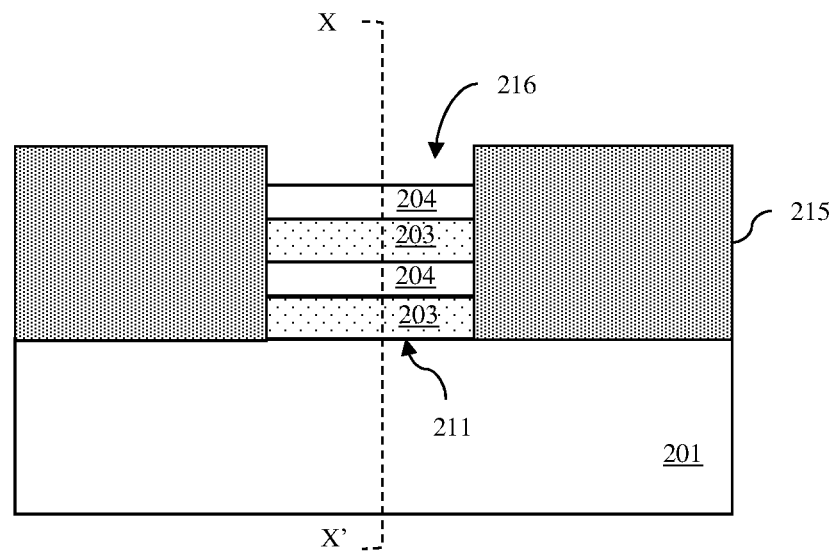
FIGS. 4A and 4B are different cross-section diagrams illustrating a partially completed structure formed according to the flow diagram of FIG. 1.
Figure 4B:
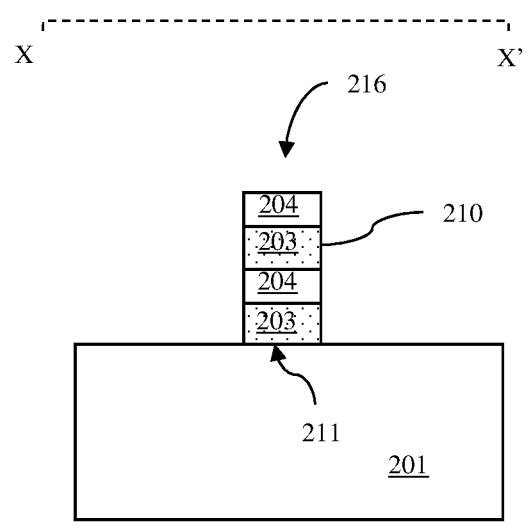
Figure 4C:
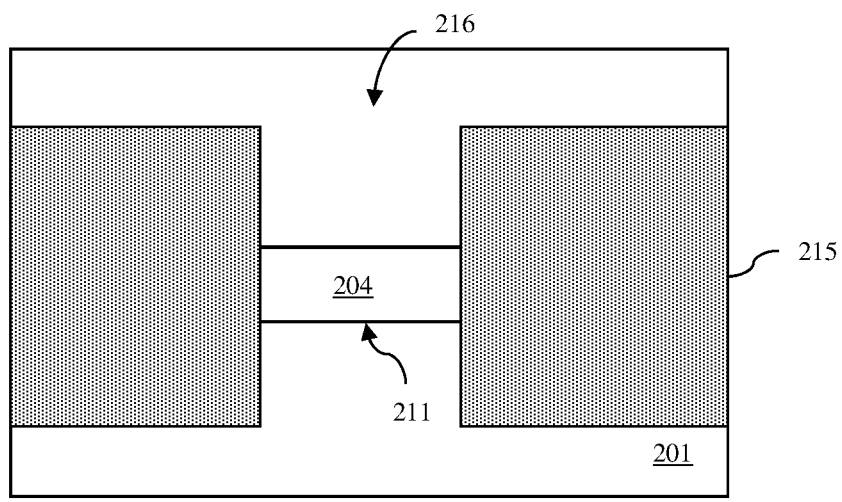
FIG. 4C is a top view diagram of the partially completed structure shown in FIGS. 4A and 4B.

A mask 215 can be formed over the multi-layer semiconductor body 210 and patterned so as to have discrete sections, which cover and protect the top surfaces and sidewalls of the second portions 212 of the multi-layer semiconductor body 210, and an opening 216, which is positioned laterally between the sections and which exposes the top surface and sidewalls of the first portion 211 of the multi-layer semiconductor body 210 (see process 110 and FIGS. 4A-4C). For example, a hardmask layer such as a silicon nitride hardmask layer can be deposited over the multi-layer semiconductor body 210. Lithographic patterning and etch processes can subsequently be performed in order to form the mask 215 with the opening 216 which exposes the top surface and sidewalls of the first portion 211 of the multi-layer semiconductor body 210.

Figure 5A:
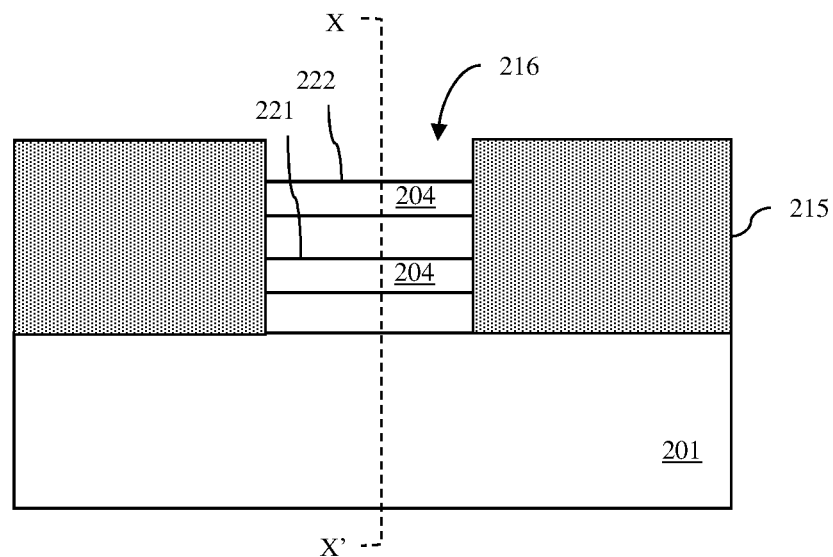
FIGS. 5A and 5B are different cross-section diagrams illustrating a partially completed structure formed according to the flow diagram of FIG. 1.
Figure 5B:
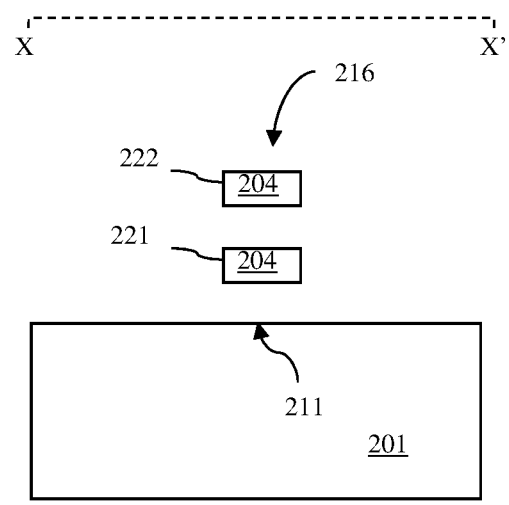

Next, exposed sections of the sacrificial material 203 can be selectively removed from the first portion of the multi-layer semiconductor body 210 (see process 112 and FIGS. 5A-5B). Specifically, an isotropic selective etch process can be performed in order to selectively etch the sacrificial material 203 over the first semiconductor material 204 and the mask 215. Those skilled in the art will recognize that a selective etch process is an etch processes wherein one material is selectively etched and, more particularly, etched at a significantly faster rate than one or more other materials so as to remove that one material without significantly impacting the other material(s). Thus, for example, if the first semiconductor material 204 is silicon, the mask 215 is silicon nitride and the sacrificial material 203 is a different semiconductor material, such as silicon germanium, the silicon germanium can be selectively etched using any of the following exemplary processes: a thermal etch process (e.g., using gaseous hydrochloric acid (HCl)), a dry plasma etch process, or wet etch process with process specifications designed to ensure the selective etch of silicon germanium over silicon and silicon nitride. Alternatively, any other suitable isotropic selective etch process could be used. By selectively etching the exposed sections of the sacrificial material 203 over the first semiconductor material 204 within the first portion 211 of the multi-layer semiconductor body 210, this process 112 results in the creation of multiple stacked elongated NSs all made of the first semiconductor material 204. For purposes of illustration, the elongated NSs are shown as NWs. However, it should be understood that, alternatively, these elongated NSs could be nanosheets or nanofins, as described above.

It should be noted that the number of stacked elongated NSs will depend upon the number of alternating layers 202 of the sacrificial material 203 and the first semiconductor material 204 formed at process 106 above. For example, four alternating layers will result in two elongated NSs, as shown. However, six alternating layers will result in three elongated NSs, eight alternating layers 202 will result in four elongated NSs, and so on. In any case, the stacked NSs will be oriented parallel to the top surface of the substrate 201, will be stacked one above the other, and will be physically separated from each other. Furthermore, the stacked elongated NSs will include at least a lower NS (referred to herein as a first NS 221) adjacent to and physically separated from the top surface of the substrate 201 and an upper NS (referred to herein as a second NS 222) that is above the first NS(s) 221 (i.e., that is essentially parallel to and physically separated from the first NS 221 such that the first NS is between the second NS 222 and the top surface of the substrate). For purposes of illustration, only one first NS 221 and one second NS 222 are shown. However, it should be understood that the figures are not intended to be limiting and that, alternatively, the stacked elongated NSs can include multiple lower NSs (i.e., multiple firsts NS 221) that are stacked one above the other and/or more than multiple upper NSs (i.e., multiple second NSs 222) above the first NS(s) 221 and stacked one above the other. It should also be noted that, if at process 108, the multi-layer semiconductor body 210 is patterned such that the first portion 211 has multiple parallel sections positioned side-by-side and extending laterally between the second portions 212, the process 112 of removing exposed sections of the sacrificial material from the first portion 211 will result in multiple, parallel, essentially identical, stacks of elongated NSs that are positioned side-by-side (not shown).

As mentioned above, due to previous optional doping processes, the first NS(s) 221 can have a first-type conductivity at a relatively low conductivity (e.g., N− conductivity) and the second NS(s) 221 can have a second-type conductivity at a relatively low conductivity level (e.g., P− conductivity). Alternatively, the first NS(s) 221 and the second NS(s) 222 can be undoped.

Figure 6A:
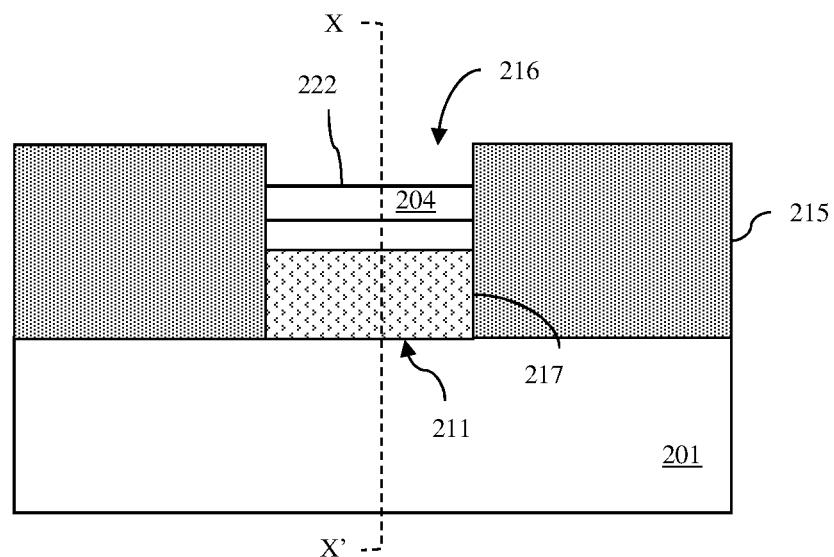
FIGS. 6A and 6B are different cross-section diagrams illustrating a partially completed structure formed according to the flow diagram of FIG. 1.
Figure 6B:
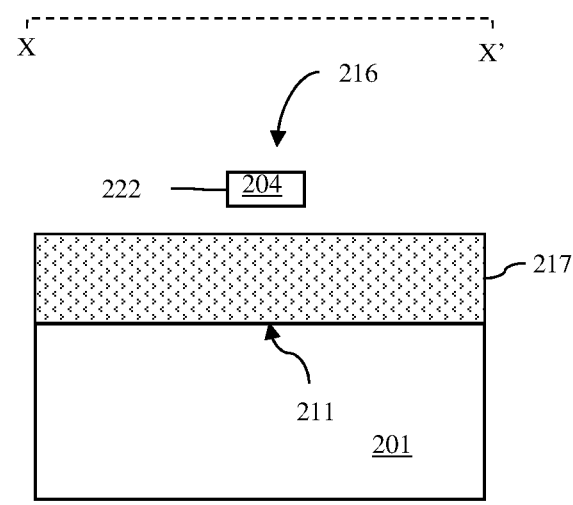
Figure 7A:
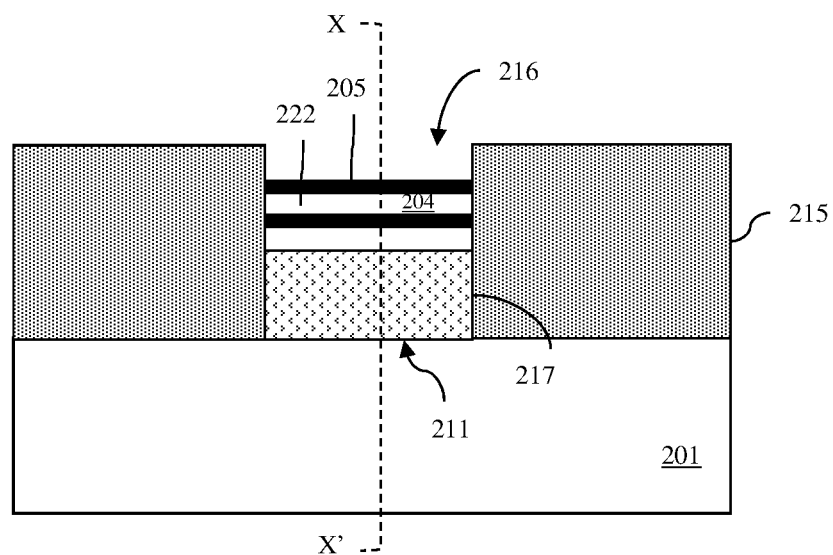
FIGS. 7A and 7B are different cross-section diagrams illustrating a partially completed structure formed according to the flow diagram of FIG. 1.
Figure 7B:
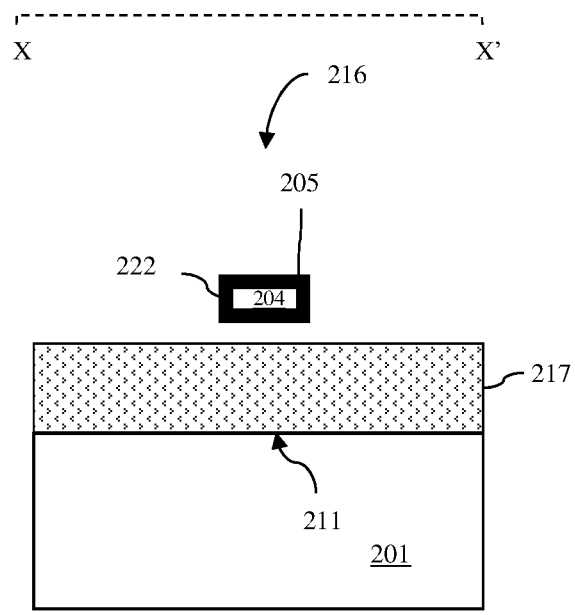
Figure 8A:
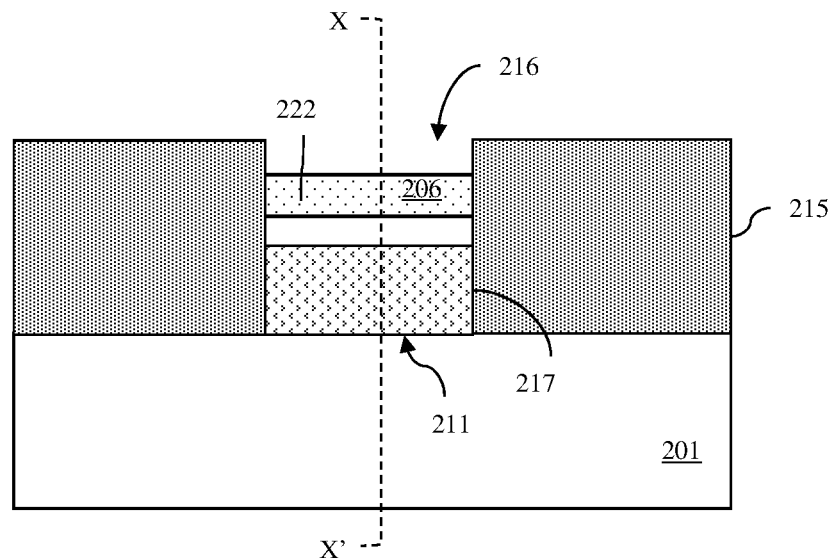
FIGS. 8A and 8B are different cross-section diagrams illustrating a partially completed structure formed according to the flow diagram of FIG. 1.
Figure 8B:
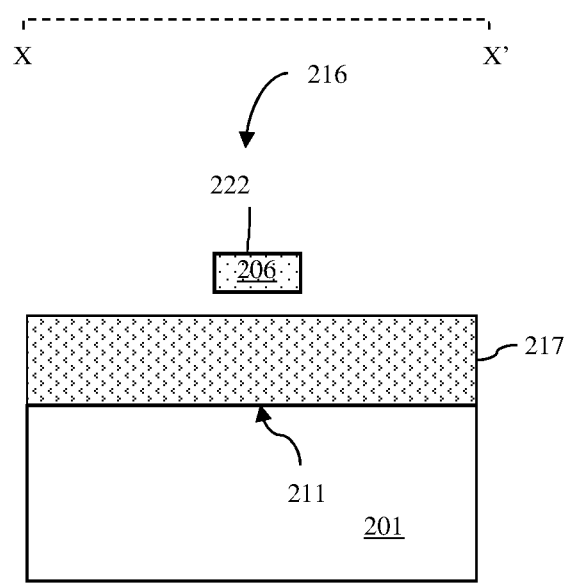

Once the stacked elongated NSs 221/222 are formed, the second NS(s) 222 can be selectively processed in order to convert the second NS(s) 222 from the first semiconductor material 204 to a second semiconductor material that is different from the first semiconductor material 204 (see process 114). For example, a dielectric layer 217 can be deposited so as to fill the opening 216, optionally polished (e.g., using a chemical mechanical polishing (CMP) process to expose the top surface of the mask 215, and then recessed to expose the second NS(s) 222 (see processes 116-118 and FIGS. 6A-6B). The dielectric layer 217 deposited at process 116 can specifically be made of a different material than the mask 215. For example, if the mask 215 is made of silicon nitride, the dielectric layer 217 can be made of silicon dioxide, silicon oxycarbide, silicon carbon nitride, silicon boron carbon, or some other dielectric material that can be selectively etch over the first semiconductor material 204 of the elongated NSs 221/222 and the mask 215. This dielectric layer 217 can then be recessed at process 118 using a selective etch process to a level below the second NS(s) 222 and above the first NS(s) 221. Next, a third semiconductor material 205 can be conformally deposited on the second NS(s) 222 (see process 120 and FIGS. 7A-7B). For example, the third semiconductor material 205 can be epitaxially grown on exposed surfaces of the second NS(s) 222 so as to wrap completely around each of the second NS(s) 222 individually. The third semiconductor material 205 can be, for example, germanium. Following epitaxial deposition of the third semiconductor material 205, a thermal anneal process can be performed in order to covert the second NS(s) 222 from the first semiconductor material 204 to a second semiconductor material 206, which is an alloy of the first semiconductor material 204 and the third semiconductor material 205 (see process 122 and FIGS. 8A-8B).

Thus, for example, if the first semiconductor material 204 is silicon and the third semiconductor material 205 is germanium, the thermal anneal process will result in a second semiconductor material 206 and, particularly, silicon germanium. Exemplary thermal anneal processes that can be used to covert silicon and germanium into silicon germanium at process 112 include one or two-step germanium condensation processes performed at temperature ranges of 900° C. to 1200° C. for 10 seconds up to 10 minutes in an ambient atmosphere or a nitrogen ($N_2$) atmosphere. It should be understood that the volume of germanium deposited onto a silicon NS as compared to the volume of the silicon NS itself will determined the ratio of germanium to silicon in the resulting silicon germanium alloy NS. That is, if the first semiconductor material 204 of the NS(s) 222 is initially silicon and the volume of germanium deposited onto each second NS 222 is the same as the volume of silicon in the second NS 222, then the result will be second NS(s) 222 made of an alloy of 50% germanium and 50% silicon. If, however, a lesser volume or a greater volume of germanium is deposited, then the result will be second NS(s) 222 made of an alloy having a greater or lesser ratio of germanium to silicon, respectively. In any case, the preferred thickness of the germanium layer would range from 2 to 5 nms.

Figure 9A:
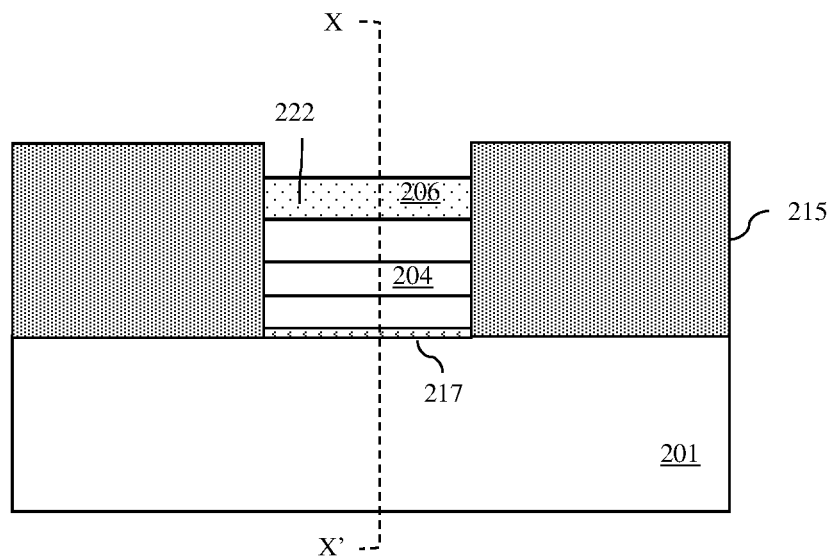
FIGS. 9A and 9B are different cross-section diagrams illustrating a partially completed structure formed according to the flow diagram of FIG. 1.
Figure 9B:
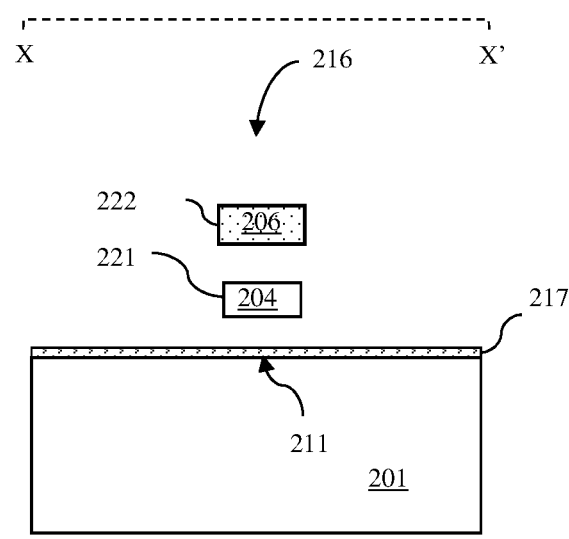

Once the second NS(s) 222 have been converted into the second semiconductor material 206, the dielectric layer 217 can be recessed to expose the first NS(s) 221 (see process 124 and FIGS. 9A-9B). That is, the dielectric layer 217 can be selectively etched over the second semiconductor material 206 of the second NS(s) 222, the first semiconductor material 204 of the first NS(s) 221 and the mask 215 in order to recess the dielectric layer 217 to a level below the first NS(s) 221 and above the top surface of the substrate 201. Following recessing of the dielectric layer 217, the mask 215 can be selectively removed (see process 126 and FIGS. 10A-10B and either FIG. 10C or 10D).

Figure 10A:
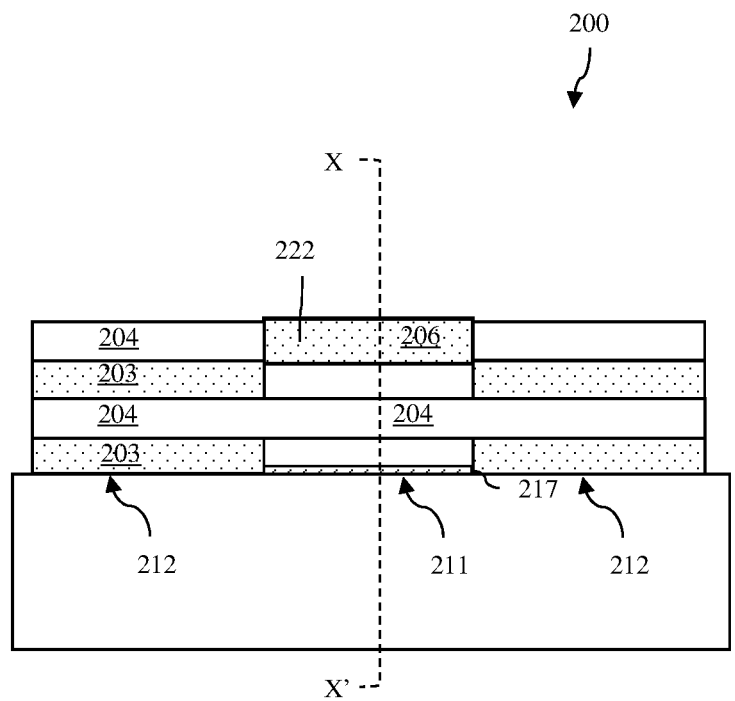
FIGS. 10A and 10B are different cross-section diagrams illustrating a semiconductor structure 200 formed according to the flow diagram of FIG. 1.
Figure 10B:
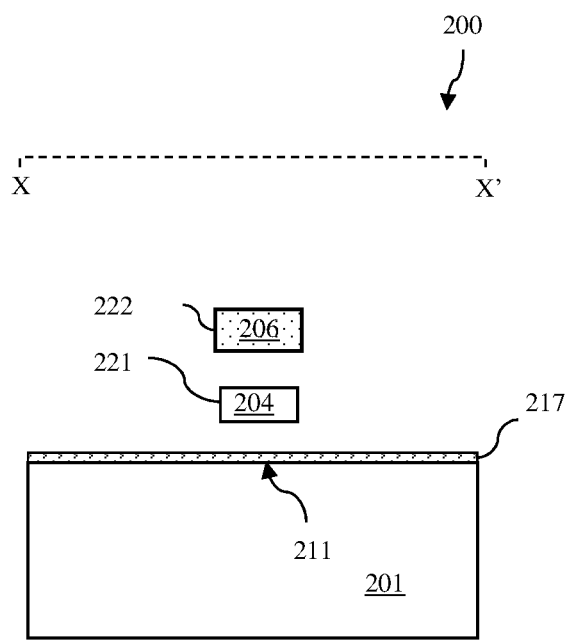
Figure 10C:
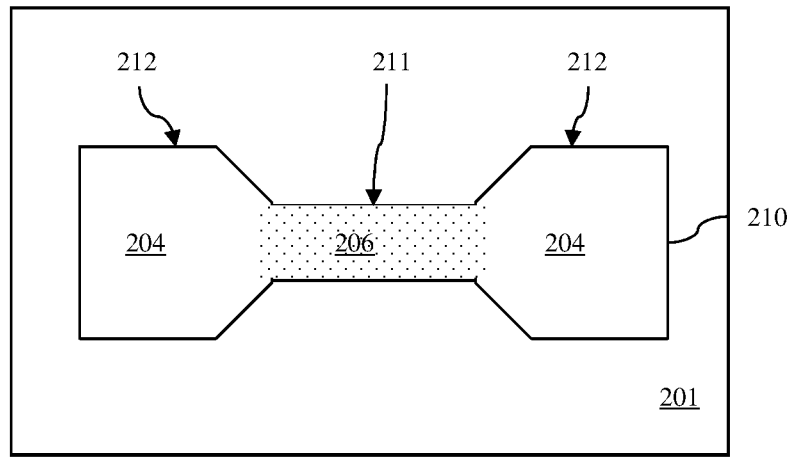
FIGS. 10C and 10D are alternative top view diagrams of the partially completed structure shown in FIGS. 10A and 10B.
Figure 10D:
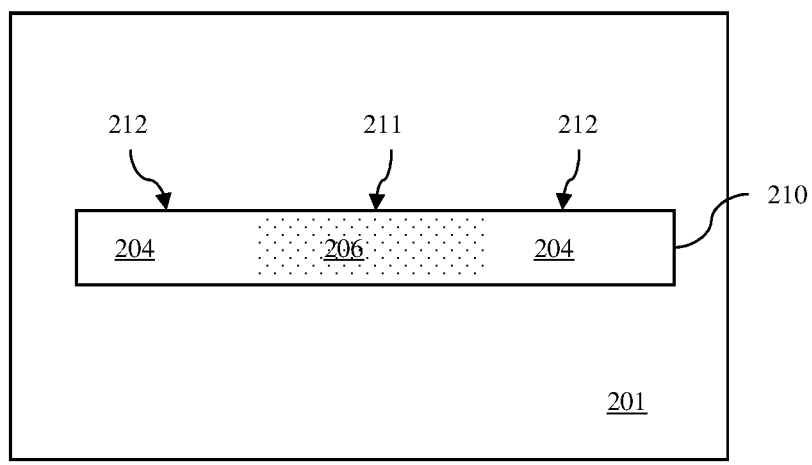

FIGS. 10A-10B are cross-section illustrations of the resulting semiconductor structure 200 and FIGS. 10C and 10D are alternative top view illustrations of the same semiconductor structure 200, As illustrated, this semiconductor structure 200 can include a substrate 201. As discussed in detail above with regard to the method, the substrate 201 can be a bulk semiconductor substrate, as illustrated, with optional ground plane doping in the form of well region(s) (not shown) in order to prevent through-substrate leakage from devices formed thereon. Alternatively, the substrate 201 can be a semiconductor layer (e.g., a silicon layer) of a semiconductor-on-insulator substrate (e.g., a silicon-on-insulator (SOI) substrate).

The semiconductor structure 200 can further include a semiconductor body 210. The semiconductor body 210 can have a first portion 211 and second portions 212, wherein the first portion 211 is positioned laterally between the second portions 212. The first portion 211 can have a first width 213a and the second portions 212 can have a second width 213b. As illustrated in FIG. 10C, the first width 213a can be less than the second width 213b. Alternatively, as illustrated in FIG. 10D, the first width 213a can be approximately equal to the second width 213b.

The first portion 211 can include stacked elongated nanoshapes (NSs) 221/222 (e.g., nanowires (NWs), nanosheets or nanofins), which are above the substrate 201 and which extend laterally between the second portions 212. These stacked NSs 221/222 can be oriented parallel to the top surface of the substrate 201, can be stacked one above the other, and can be physically separated from each other. The stacked NSs can include one or more lower NSs (referred to herein as first NS(s) 221), which are made of a first semiconductor material 204, and one or more upper NSs (referred to herein as second NS(s) 222), which are above the first NS(s) 221 and which are made of a second semiconductor material 206 that is different from the first semiconductor material 204. For example, the first semiconductor material 204 of the first NS(s) 221 can be silicon and the second semiconductor material 206 of the second NS(s) 222 can be silicon germanium. The height of each NS 221/222 and the width of each NS 221/222 (which corresponds to the first width 213a) can be constrained to tens of nanometers or less (i.e., constrained to 100 nm or less), as discussed in detail above.

Referring again to the flow diagram of FIG. 1, the semiconductor structure 200 of FIGS. 10A-10B and FIG. 10C or FIG. 10D can be used to form multiple stacked devices. Specifically, the first NS(s) 221 and the second NS(s) 222 can be used to form one or more stacked first devices 251 and one or more stacked second devices 252, respectively, wherein the second device(s) 252 is/are stacked above the first device(s) 251 such that the first device(s) 251 are positioned between the second device(s) 252 and the top surface of the substrate 201 (see process 128).

Figure 11A:
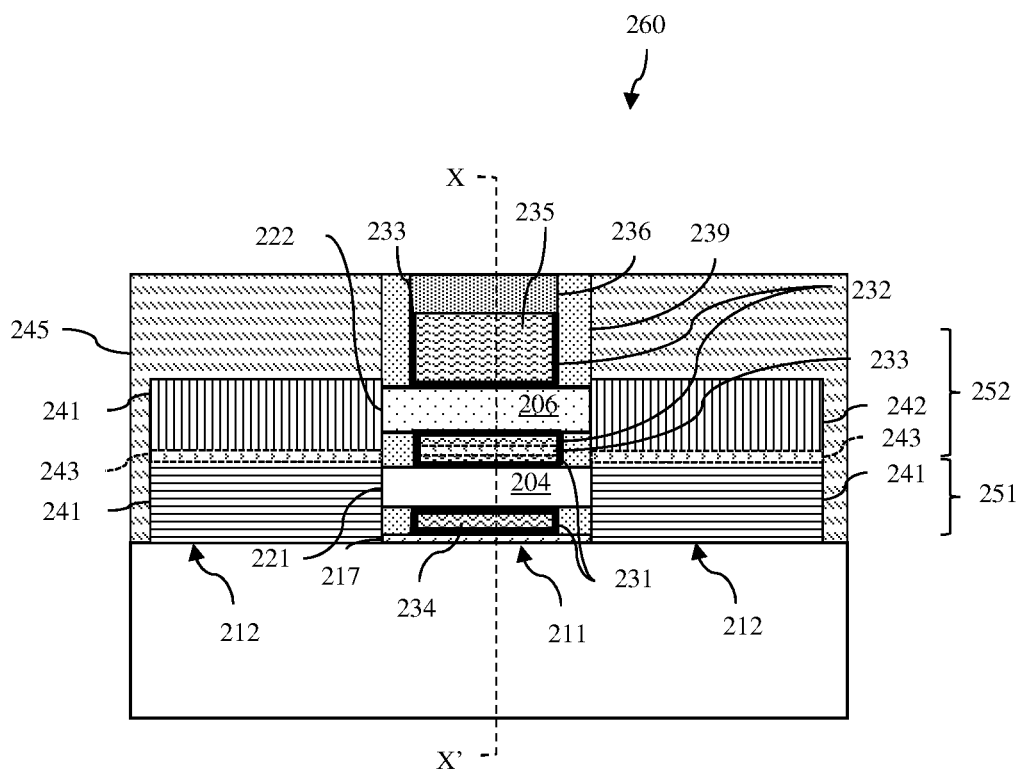
FIGS. 11A and 11B are different cross-section diagrams illustrating a semiconductor structure 260 formed according to the flow diagram of FIG. 1 and using the semiconductor structure 200 of FIGS. 10A-10B and either 10C or 10D.
Figure 11B:
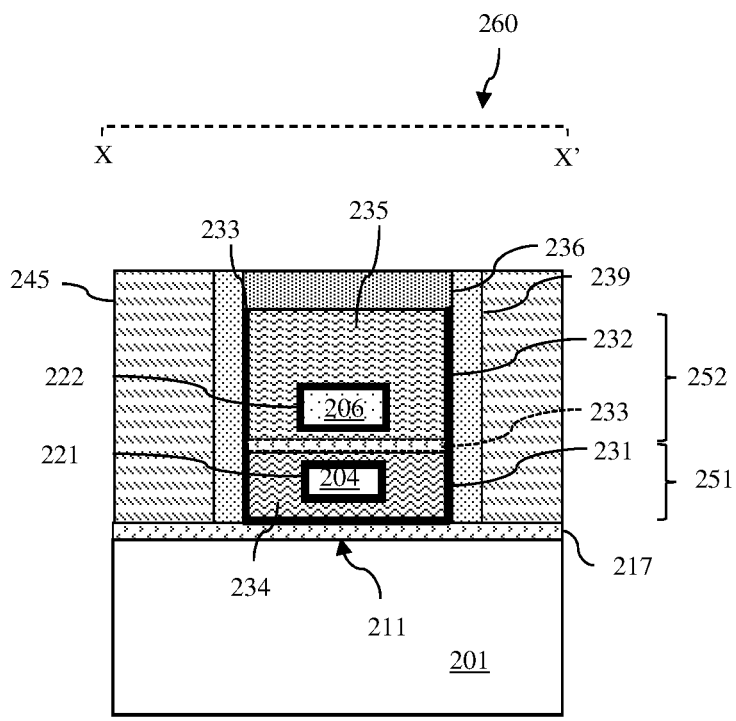

For example, in one exemplary method embodiment, the semiconductor structure 200 can be further processed in order to form an additional semiconductor structure 260, which includes at least one first field effect transistor (FET) 251 (e.g., an N-type FET) that incorporates one or more of the first NS(s) 221 as channel region(s) and at least one second FET 252 (e.g., a P-type FET) that incorporates one or more of the second NS(s) 222 as channel region(s), wherein the FET devices are stacked with the second FET(s) 252 being above the first FET(s) 251 such that the first FET(s) 251 are between the second FET(s) 252 and the top surface of the substrate 201 (see FIGS. 11A-11B).

To form the semiconductor structure 260, the following exemplary processes can be performed. A sacrificial gate structure, having a sacrificial gate cap, can be formed adjacent to the first portion 211 of the semiconductor body 210 such that it wraps around the first NS(s) 221 and the second NS(s) 222. A gate sidewall spacer 239 can be formed adjacent to the sacrificial gate structure. Source/drain recesses can be formed in the second portions 212 of the semiconductor body 210 on opposing sides of the sacrificial gate structure. The source/drain recesses can, for example, extend to or partially into the substrate 201. Alternatively, the source/drain recesses can extend to or into the lowest layer of the sacrificial material 203 within the second portions 212.

Subsequently, first source/drain regions 241 with a first-type conductivity at a relatively high conductivity level (e.g., N+ conductivity) can be formed (e.g., by epitaxial deposition and in-situ doping) in lower portions of the source/drain recesses such that the first NS(s) 221 is/are positioned laterally between the first source/drain regions 241. Second source/drain regions 242 with a second-type conductivity at a relatively high conductivity level (e.g., P+ conductivity) can be formed (e.g., by epitaxial deposition and in-situ doping) in upper portions of the source/drain recesses above the first source/drain regions 241 such that the second NS(s) 222 is/are positioned laterally between the second source/drain regions 242. It should be noted that the epitaxial semiconductor material used for the first source/drain regions 241 and the second source/drain regions 242 can be the same semiconductor material (e.g., silicon), which is simply in-situ doped so as to have the different type conductivities. Alternatively, the epitaxial semiconductor materials used for the first source/drain regions 241 and the second source/drain regions 242 can be different semiconductor materials, which are pre-selected to provide optimal mobility in the NWFET channel regions. Optionally, prior to forming the second source/drain regions 242, isolation region(s) 243 (e.g., a dielectric isolation region, such as a silicon dioxide isolation region; etc.) can be formed on one or both of the first source/drain regions 241 to provide electrical isolation between adjacent first and second source/drain regions. In this case, it should be understood that processes should be performed to prevent isolation material from forming on exposed vertical surface(s) of the second NS(s) 222 and/or to remove isolation material that has formed on the exposed vertical surface(s) of the second NS(s) prior to formation of the second source/drain regions 242. Furthermore, when isolation region(s) 243 are formed above first source/drain region(s) 241, the second source/drain region(s) 242 can be formed above the isolation region(s) 243 by lateral epitaxial deposition on the exposed vertical surface(s) of the second NS(s) 222.

After the second source/drain regions 242 are formed in the upper portions of the source/drain recesses, one or more layers of interlayer dielectric (ILD) material 245 can be deposited. The ILD material 245 can be, for example, silicon dioxide or some other suitable ILD material (e.g., borophosphosilicate glass (BPSG), tetraethyl orthosilicate (TEOS), fluorinated tetraethyl orthosilicate (FTEOS), etc.). The ILD material 245 can subsequently be polished (e.g., using a CMP process) to expose the top surface of the sacrificial gate structure and the sacrificial gate structure can be selectively removed, thereby creating a second opening (i.e., a gate opening) that is bounded by the gate sidewall spacer 239 and that exposes the stacked elongated NSs including the lower NS(s) (i.e., the first NS(s) 221) and the upper NS(s) (i.e., the second NS(s) 222).

Then, a first replacement metal gate (RMG) structure 231, having a first work function, can be formed in the second opening such that it wraps around each first NS 221 and a second RMG structure 232, having a second work function that is different from the first work function, can be formed in the second opening above the first RMG structure 231 such that it wraps around each second NS 222. Exemplary processes that can be used to form the RMGs 231/232 can include conformally depositing a gate dielectric layer into the second opening such that it lines the second opening and wraps around each elongated NS 221/222. A first work function metal layer 234 for the first RMG 231 can be deposited onto the gate dielectric layer and etched back so that it wraps around the first NS(s) 221 but not the second NS(s) 222. Optionally, the first work function metal layer 234 can be a conformal work function metal layer and a conductive fill material (not shown) can be deposited and recessed so that it fills remaining space within the lower portion of the second opening below the level of the second NS(s) 222. A second work function metal layer 235 for the second RMG 232 can be deposited in the upper portion of the second opening such that it wraps around the second NS(s) 222. Optionally, the second work function metal layer 235 can be a conformal work function metal layer and a conductive fill material (not shown) can be deposited to fill any remaining space within the upper portion of the second opening. The second RMG 232 can then be recessed slightly to enable formation of a dielectric gate cap 236 within the second opening above the second RMG 232. For example, a dielectric gate cap layer can be deposited into a recess formed above the second RMG 232 and a polishing process (e.g., a CMP process) can be performed in order to remove the dielectric gate cap material from above the ILD material 245, thereby forming the dielectric gate cap 236. Optionally, prior to forming the second RMG 232, an isolation region 233 (e.g., a dielectric isolation region, such as a silicon dioxide isolation region) can be formed on the first RMG 231 to provide electrical isolation between the two RMGs 231/232.

For purpose of illustration, the exemplary method embodiment described above uses replacement metal gate (RMG) processing to form the first RMG 231 of the first FET 251 and the second RMG 232 of the second FET 252. However, it should be understood that this description is not intended to be limiting and that, alternatively, gate-first gate processing could be used to form the first gate structure 231 and the second gate structure 232.

Additional processing can then be performed in order to complete the semiconductor structure 260, which includes the first FET 251 and the second FET 252 stacked above the first FET 251. The additional processing can include, but is not limited to, the formation of middle of the line (MOL) contacts to the gate structures 231/232 and to the source/drain regions 241/242 and back end of the line (BEOL) processes.

It should be noted that in this exemplary method embodiment, if an isolation region 233 is formed between the first and second RMGs 231/232 or if isolation region(s) 243 are formed between adjacent first and second source/drain regions 241/242, processes should be performed in order to ensure that the MOL contacts to the lower RMG (i.e., to the first RMG 231) and to the lower source/drain region(s) (i.e., to the first source/drain region(s) 241) are electrically isolated from the upper RMG (i.e., the second RMG 232) and from the upper source/drain region(s) (i.e., the second source/drain region(s) 242). These processes can include, for example, ensuring that the first RMG 231 extends laterally beyond the second RMG 232 so that the contact to the first RMG 231 can extend vertically through dielectric material and land on the first RMG 231 without contacting the second RMG 232. These processes can also include, for example, ensuring that the first source/drain regions 241 extends laterally beyond the second source/drain regions 242 so that the contacts to the first source/drain regions 241 can extend vertically through dielectric material and land on the first source/drain regions 241 without contacting the second source/drain regions 242. Alternatively, these processes can include the formation of the MOL contacts to the first RMG 231 and the first source/drain regions 241 such that the sidewalls of these contacts are lined with isolation material.

Additionally, it should be noted that, purposes of illustration, this method is described above and illustrated in the figures with respect to the formation of only a single first FET 251 that incorporates a single first NS 221 and, stacked above the first FET 251, a single second FET 252 that incorporates a single second NS 222. However, it should be understood that, alternatively, additional embodiments of the method could include any of the following: (a) the formation of a single first FET 251 that incorporates multiple first NSs 221, which are stacked and/or side-by-side, as channel regions and, stacked above the first FET 251, a single second FET 252 that incorporates a single second NS 222 as a channel region; (b) the formation of a single first FET 251 that incorporates a single first NS 221 as a channel region and, stacked above the first FET 251, a single second FET 252 that incorporates multiple second NSs 222, which are stacked and/or side-by-side, as channel regions; (c) the formation of a single first FET 251 that incorporates multiple first NSs 221, which are stacked and/or side-by-side, as channel regions and, stacked above the first FET 251, a single second FET 252 that incorporates multiple second NSs 222, which are are stacked and/or side-by-side, as channel regions; (d) the formation of multiple stacked first FETs 251, each of which incorporates one or more first NSs 221 as channel region(s) and, stacked above the stacked first FETs 251, a single second FET 252 that incorporates one or more second NSs 222 as channel region(s); (e) the formation of a single first FET 251 that incorporates one or more first NSs 221 as channel region(s) and, stacked above the first FET 251, multiple stacked second FETs 252, each of which incorporates one or more second NSs 222 as channel region (s); and (f) the formation of multiple stacked first FETs 251, each of which incorporates one or more first NSs 221 as channel region(s) and, stacked above the first FETs 251, multiple stacked second FETs 252, each of which incorporates one or more second NSs 222 as channel region(s). In method embodiments that include stacked first FETs and/or stacked second FETs, stacked FETs with the same type conductivity can share a gate structure and/or source/drain regions or can have discrete gate structures (e.g., electrically isolated by isolation regions) and/or discrete source/drain regions (e.g., electrically isolated by isolation regions).

In any case, the resulting semiconductor structure 260 of FIGS. 11A-11B can include a substrate 201. As discussed in detail above with regard to the methods, the substrate 201 can be a bulk semiconductor substrate, as illustrated, with optional ground plane doping in the form of well region(s) (not shown) in order to prevent through-substrate leakage from devices formed thereon. Alternatively, the substrate 201 can be a semiconductor layer (e.g., a silicon layer) of a semiconductor-on-insulator substrate (e.g., a silicon-on-insulator (SOI) substrate).

The semiconductor structure 260 can further include, above a top surface of the substrate, at least one first field effect transistor (FET) 251, which has has a first-type conductivity (e.g., an N-type FET) and which incorporates one or more first nanoshapes (NSs) 221 as channel region(s). The semiconductor structure 260 can further include at least one second FET 252, which has a second-type conductivity (e.g., a P-type NWFET) and which incorporates one or more second NS(s) 222 as channel region(s). The FETs 251/522 can be arranged in a stack one above the other with the second FET(s) 252 being above the first FET(s) 251 such that the first FET(s) 251 are between the second FET(s) 252 and the top surface of the substrate 201.

Specifically, the semiconductor structure 260 can include stacked elongated nanoshapes (NSs) 221/222 that are oriented parallel to the top surface of the substrate 201, that are stacked one above the other, and that are physically separated from each other. The stacked elongated NSs can include one or more lower NSs (referred to herein as first NS(s) 221, as discussed in detail above with regard to the methods), which are either undoped or have the second-type conductivity at a relatively low conductivity level (e.g., P−conductivity), which function as first channel region(s) for the first FET(s) 251 and which are made of a first semiconductor material 204. The stacked elongated NSs can also include one or more upper NSs (referred to herein as second NS(s) 222, as discussed in detail above with regard to the methods), which function as second channel region(s) for the second FET(s) 252, which are above the first NS(s) 221, and which are made of a second semiconductor material 206 that is different from the first semiconductor material 204. The first semiconductor material 204 can be, for example, silicon and the second semiconductor material 206 can be, for example, silicon germanium. These stacked elongated NSs can be nanowires (NWs), nanosheets or nanofins. That is, the thickness (also referred to as the height) of each elongated NS 221/222 and/or the width (also referred to as the depth) of each elongated NS 221/222 can be constrained to tens of nanometers or less (i.e., constrained to 100 nm or less), as discussed in detail above.

The first FET 251 can further include first source/drain regions 241 and one or more first NS(s) 221 (i.e., first channel region(s)) that can extend laterally between the first source/drain regions 241. The first FET 251 can further include a first gate structure 231 (e.g., a first replacement metal gate (RMG) structure), which has a first work function and which is wrapped around the first NS(s) 221. As mentioned above, the first FET 251 can have the first-type conductivity (e.g., N-type conductivity). Thus, the first source/drain regions 241 can have the first-type conductivity at a relatively high conductivity level (e.g., N+ conductivity).

The second FET 252 can further include second source/drain regions 242. The second source/drain regions 242 can be above the first source/drain regions 241 and one or more second NS(s) 222 (i.e., second channel region(s)) can be positioned laterally between the second source/drain regions 242. The second FET 252 can further include a second gate structure 232 (e.g., a second replacement metal gate (RMG) structure) above the first gate structure 231 and wrapped around the second NS(s) 222. As mentioned above, the second FET 252 can have the first-type conductivity (e.g., P-type conductivity). Thus, the second source/drain regions 242 can have the second-type conductivity at a relatively high conductivity level (e.g., P+ conductivity).

The semiconductor structure 260 can further include any of the following: an isolation region 233 electrically isolating the first gate structure 231 from the second gate structure 232 and/or one or more additional isolation regions 243, wherein each isolation region 243 electrically isolates a first source/drain region 241 from the second source/drain region 242 above. It should be noted that in structure embodiments that include multiple stacked first FETs with the first-type conductivity (not shown), the stacked first FETs can share the same first gate structure or can have discrete first gate structures (e.g., electrically isolated by isolation regions) and/or can share first source/drain regions or can have discrete first source/drain regions (e.g., electrically isolated by isolation regions). Similarly, in structure embodiments that include multiple stacked second FETs with the second-type conductivity (not shown), the stacked second FETs can share the same second gate structure or can have discrete second gate structures (e.g., electrically isolated by isolation regions) and/or can share second source/drain regions or can have discrete second source/drain regions (e.g., electrically isolated by isolation regions).

By enabling the stacking of elongated NSs that are made of different materials as well as the stacking of different devices (e.g., FETs with different type conductivities), the disclosed methods result in semiconductor structures 200 and 260 that consume less of the available surface area of the substrate and, thereby allow for further size scaling.

In the above-described method and structure embodiments that include FETs 251 and 252, the first FET 251 has the first-type conductivity (e.g., is an N-type FET) and the second FET 252 has a second-type conductivity (e.g., is a P-type FET). For an N-type FET, the channel region(s) can have P-type conductivity at a relatively low conductivity level (or can be undoped) and the source/drain regions can have N-type conductivity and a relatively high conductivity level; whereas, for a P-type FET, the channel region(s) can have N-type conductivity at a relatively low conductivity level (or can be undoped) and the source/drain regions can have P-type conductivity at a relatively high conductivity level. Those skilled in the art will recognize that different dopants can be used to achieve the different conductivity types and that the dopants may vary depending upon the different semiconductor materials used. For example, a silicon-based semiconductor material (e.g., silicon, silicon germanium, etc.) having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having N-type conductivity is typically doped with silicon (Si). Those skilled in the art will also recognize that different conductivity levels will depend upon the relative concentration levels of the dopants.

Additionally, in the above-described method and structure embodiments that include the FETs 251 and 252, the first FET 251 can have a first gate structure 231 with a first work function and the second FET 252 can have a second gate structure 232 with a second work function. In these RMGs, the gate dielectric layer can be a silicon dioxide gate dielectric layer. Alternatively and preferably, the gate dielectric layer can be a high-K gate dielectric layer. The high-K gate dielectric layer can be, for example, a dielectric material with a dielectric constant that is greater than the dielectric constant of silicon dioxide (i.e., greater than 3.9). Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The work function metal of the RMG can include a metal material or metal alloy material that is preselected in order to achieve the optimal gate conductor work function given the conductivity type of the FET. For example, the optimal gate conductor work function of the N-type FET 251 will be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal gate conductor work function for the P-type FET 252 will be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Any conductive fill material used can be a fill metal or fill metal alloy, such as tungsten, a tungsten alloy (e.g., tungsten silicide or titanium tungsten), cobalt, aluminum or any other suitable fill metal or fill metal alloy.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are a method of forming stacked elongated nanoshapes (NSs) (e.g., nanowires (NWs)) of different semiconductor materials above a substrate, a method of forming different stacked devices (e.g., stacked field effect transistors (FETs) with different type conductivities for complementary metal oxide semiconductor (CMOS) circuitry) using the stacked NSs, and the resulting structures. Specifically, stacked elongated NSs made of the same first semiconductor material can be formed above a substrate. The stacked elongated NSs can include at least a first NS and a second NS above the first NS. The second NS can then be selectively processed in order to convert the second NS from the first semiconductor material to a second semiconductor material. The first and second NSs can subsequently be used to form first and second devices, respectively, wherein the second device is stacked above the first device. The first and second devices can be, for example, first and second FETs, respectively, having different type conductivities. By enabling the stacking of NSs that are made of different materials as well as the stacking of different devices (e.g., FETs with different type conductivities), the disclosed methods result in structures that consume less of the available surface area of the substrate and, thereby allow for further size scaling.

What is claimed is:

1. A method comprising:
    forming elongated nanoshapes comprising a first semiconductor material, the elongated nanoshapes being stacked on a substrate and comprising at least:
        a first nanoshape above, parallel to and physically separated from a surface of the substrate; and
        a second nanoshape aligned above, parallel to and physically separated from the first nanoshape such that the first nanoshape is stacked vertically between the second nanoshape and the surface of the substrate; and
    selectively processing the second nanoshape to convert the second nanoshape from the first semiconductor material to a second semiconductor material that is different from the first semiconductor material,
    the forming of the elongated nanoshapes comprising:
        forming a multi-layer semiconductor body adjacent to the surface of the substrate, the multi-layer semiconductor body comprising at least four alternating layers of a sacrificial material and the first semiconductor material, wherein the sacrificial material is different from the first semiconductor material;
        forming a mask over the multi-layer semiconductor body, the mask having an opening that exposes a first portion of the multi-layer semiconductor body, the first portion being positioned laterally between second portions; and
        selectively removing exposed sections of the sacrificial material from the first portion, and
    the selectively processing of the second nanoshape comprising:
        after the selectively removing of the exposed sections, depositing a dielectric layer so as to fill the opening;
        recessing the dielectric layer in the opening to expose the second nanoshape;
        depositing a third semiconductor material on exposed top, bottom and side surfaces of the second nanoshape; and
        performing an anneal process to covert the second nanoshape from the first semiconductor material to the second semiconductor material, the second semiconductor material being an alloy of the first semiconductor material and the third semiconductor material.

2. The method of claim 1, the elongated nanoshapes comprising any of nanowires, nanosheets and nanofins.

3. The method of claim 1, the sacrificial material comprising a sacrificial semiconductor material.

4. The method of claim 1, the first semiconductor material comprising silicon, the second semiconductor material comprising silicon germanium and the third semiconductor material comprising germanium.

5. The method of claim 1, further comprising, after the performing of the anneal process, further recessing the dielectric layer to expose the first nanoshape.

6. A method comprising:
forming elongated nanoshapes comprising a first semiconductor material, the elongated nanoshapes being stacked on a substrate and comprising at least:
a first nanoshape above, parallel to and physically separated from a surface of the substrate; and
a second nanoshape aligned above, parallel to and physically separated from the first nanoshape such that the first nanoshape is stacked vertically between the second nanoshape and the surface of the substrate;
selectively processing the second nanoshape to convert the second nanoshape from the first semiconductor material to a second semiconductor material that is different from the first semiconductor material; and
after the selectively processing, forming a first transistor using the first nanoshape and forming a second transistor using the second nanoshape such that the first transistor is between the second transistor and the surface of the substrate.

7. The method of claim 6, the elongated nanoshapes comprising any of nanowires, nanosheets and nanofins.

8. The method of claim 6, the forming of the elongated nanoshapes comprising:
forming a multi-layer semiconductor body adjacent to the surface of the substrate, the multi-layer semiconductor body comprising at least four alternating layers of a sacrificial material and the first semiconductor material, wherein the sacrificial material is different from the first semiconductor material;
forming a mask over the multi-layer semiconductor body, the mask having an opening that exposes a first portion of the multi-layer semiconductor body, the first portion being positioned laterally between second portions; and
selectively removing exposed sections of the sacrificial material from the first portion.

9. The method of claim 8, the sacrificial material comprising a sacrificial semiconductor material.

10. The method of claim 8, the selectively processing of the second nanoshape comprising:
after the selectively removing of the exposed sections, depositing a dielectric layer so as to fill the opening;
recessing the dielectric layer in the opening to expose the second nanoshape;
depositing a third semiconductor material on exposed top, bottom and side surfaces of the second nanoshape; and
performing an anneal process to covert the second nanoshape from the first semiconductor material to the second semiconductor material, the second semiconductor material being an alloy of the first semiconductor material and the third semiconductor material.

11. The method of claim 10, the first semiconductor material comprising silicon, the second semiconductor material comprising silicon germanium and the third semiconductor material comprising germanium.

12. The method of claim 10, the first transistor having a first-type conductivity and the second transistor having a second-type conductivity that is different from the first-type conductivity and the forming of the first transistor and the second transistor comprising:
after the performing of the anneal process, recessing the dielectric layer to expose the first nanoshape;
removing the mask;
forming a sacrificial gate structure with a gate sidewall spacer adjacent to the first nanoshape and the second nanoshape;
forming recesses in the second portions of the multi-layer semiconductor body;
forming first source/drain regions with the first-type conductivity in the recesses such that the first nanoshape is positioned laterally between the first source/drain regions;
forming second source/drain regions with the second-type conductivity above the first source/drain regions such that the second nanoshape is positioned laterally between the second source/drain regions;
selectively removing the sacrificial gate structure to create a second opening that exposes the first nanoshape and the second nanoshape;
forming a first gate structure in the second opening adjacent to the first nanoshape, the first gate structure having a first work function; and
forming a second gate structure above the first gate structure and adjacent to the second nanoshape, the second gate structure having a second work function that is different from the first work function.

13. The method of claim 12, further comprising at least one of the following:
before the forming of the second gate structure, forming an isolation region on the first gate structure; and
before the forming of the second source/drain regions, forming at least one additional isolation region on at least one first source/drain region.

14. A method comprising:
forming elongated nanoshapes comprising a first semiconductor material, the elongated nanoshapes being stacked and comprising at least:
a first nanoshape adjacent to a surface of a substrate; and
a second nanoshape parallel to and physically separated from the first nanoshape such that the first nanoshape is between the second nanoshape and the surface of the substrate;
selectively processing the second nanoshape to convert the second nanoshape from the first semiconductor material to a second semiconductor material that is different from the first semiconductor material; and
after the selectively processing, forming a first transistor using the first nanoshape and forming a second transistor using the second nanoshape such that the first transistor is between the second transistor and the surface of the substrate,
wherein the forming of the elongated nanoshapes comprises:
forming a multi-layer semiconductor body adjacent to the surface of the substrate, the multi-layer semiconductor body comprising at least four alternating layers of a sacrificial material and the first semiconductor material, wherein the sacrificial material is different from the first semiconductor material;
forming a mask over the multi-layer semiconductor body, the mask having an opening that exposes a first portion of the multi-layer semiconductor body, the first portion being positioned laterally between second portions; and
selectively removing exposed sections of the sacrificial material from the first portion,
wherein the selectively processing of the second nanoshape comprises:

after the selectively removing of the exposed sections, depositing a dielectric layer so as to fill the opening;
recessing the dielectric layer in the opening to expose the second nanoshape;
depositing a third semiconductor material on the second nanoshape; and
performing an anneal process to covert the second nanoshape from the first semiconductor material to the second semiconductor material, the second semiconductor material being an alloy of the first semiconductor material and the third semiconductor material,
wherein the first transistor has a first-type conductivity and the second transistor has a second-type conductivity that is different from the first-type conductivity, and
wherein the forming of the first transistor and the second transistor comprises:
after the performing of the anneal process, recessing the dielectric layer to expose the first nanoshape;
removing the mask;
forming a sacrificial gate structure with a gate sidewall spacer adjacent to the first nanoshape and the second nanoshape;
forming recesses in the second portions of the multi-layer semiconductor body;
forming first source/drain regions with the first-type conductivity in the recesses such that the first nanoshape is positioned laterally between the first source/drain regions;
forming second source/drain regions with the second-type conductivity above the first source/drain regions such that the second nanoshape is positioned laterally between the second source/drain regions;
selectively removing the sacrificial gate structure to create a second opening that exposes the first nanoshape and the second nanoshape;
forming a first gate structure in the second opening adjacent to the first nanoshape, the first gate structure having a first work function; and
forming a second gate structure above the first gate structure and adjacent to the second nanoshape, the second gate structure having a second work function that is different from the first work function.

15. The method of claim 14, the elongated nanoshapes comprising any of nanowires, nanosheets and nanofins.

16. The method of claim 14, the sacrificial material comprising a sacrificial semiconductor material.

17. The method of claim 14, the first semiconductor material comprising silicon, the second semiconductor material comprising silicon germanium and the third semiconductor material comprising germanium.

18. The method of claim 14, further comprising at least one of the following:
before the forming of the second gate structure, forming an isolation region on the first gate structure; and
before the forming of the second source/drain regions, forming at least one additional isolation region on at least one first source/drain region.

* * * * *